(12) United States Patent
Takahashi et al.

(10) Patent No.: US 6,699,645 B2
(45) Date of Patent: *Mar. 2, 2004

(54) METHOD FOR THE FORMATION OF RESIST PATTERNS

(75) Inventors: Makoto Takahashi, Kawasaki (JP); Satoshi Takechi, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/810,773

(22) Filed: Mar. 5, 1997

(65) Prior Publication Data

US 2001/0001703 A1 May 24, 2001

(30) Foreign Application Priority Data

Mar. 7, 1996 (JP) ............................................. 8-049946

(51) Int. Cl.$^7$ .................................................. B03F 7/30
(52) U.S. Cl. ........................ 430/326; 430/322; 430/331
(58) Field of Search ................................ 430/322, 326, 430/331

(56) References Cited

U.S. PATENT DOCUMENTS

| 3,891,439 | A | * | 6/1975 | Katz et al. |
|---|---|---|---|---|
| 4,820,621 | A | * | 4/1989 | Tanka et al. |
| 4,914,006 | A | * | 4/1990 | Kato et al. |
| 5,094,934 | A | * | 3/1992 | Lazarus et al. |
| 5,128,231 | A | * | 7/1992 | Itoh et al. |
| 5,149,614 | A | * | 9/1992 | Akiyama et al. |
| 5,252,436 | A | * | 10/1993 | Binder et al. |
| 5,326,674 | A | * | 7/1994 | Toyama et al. |
| 5,683,856 | A | * | 11/1997 | Aoai et al. |
| 5,738,975 | A | * | 4/1998 | Nakano et al. |

FOREIGN PATENT DOCUMENTS

| JP | 4-39665 | | 2/1992 |
|---|---|---|---|
| JP | 5-257281 | | 10/1993 |
| JP | 5-257284 | * | 10/1993 |
| JP | 5-257285 | | 10/1993 |
| JP | 5-265212 | * | 10/1993 |
| JP | 7-234511 | * | 9/1995 |

OTHER PUBLICATIONS

Translation of JP 5–257284, Oct. 1993.*
English translation of JP 5–265212, Oct. 1993.*
Derwent abstract of JP 5–265212, Oct. 1993.*

* cited by examiner

*Primary Examiner*—Rosemary Ashton
(74) *Attorney, Agent, or Firm*—Armstrong, Kratz, Quintos, Hanson & Brooks, LLP

(57) ABSTRACT

Method for the formation of resist patterns by using a chemically amplified resist which comprises an alkali-insoluble base polymer or copolymer and an acid generator, in which the patternwise exposed film of said resist is developed with an organic alkaline developer in the presence of a surface active agent containing a higher alkyl group in a molecule thereof. The resist patterns have no drawback such as cracks and peeling, and thus can be advantageously used in the production of semiconductor devices such as LSIs and VLSIs.

14 Claims, No Drawings

METHOD FOR THE FORMATION OF RESIST PATTERNS

BACKGROUND OF THE INVENTION

1. Field of the Invention

The present invention relates to a method for forming resist patterns. More particularly, the present invention relates to a method for forming fine resist patterns by using a chemical amplification resist having high resolution, high sensitivity and an excellent dry etching resistance. A pattern formation method of the present invention can be advantageously used in the production of, for example, semiconductor devices such as semiconductor integrated circuits (ICs) and others, because the method of the present invention can effectively prevent crack formation in the resist pattern and peeling of the resist pattern during the developing process of the resist patterns, and it does not require a specific waste treatment for the used developer.

2. Description of Related Art

Recently, due to increase in the integration degree of semiconductor ICs, highly integrated devices such as LSIs and VLSIs have been practically utilized. Further, in addition to this tendency, the minimum pattern size of the ICs generally has a size in the submicron order, and now even finer patterns are required. In the formation of a fine pattern, it is essential to use a lithographic process comprising coating a base or substrate having a film to be fabricated with a resist, selectively exposing the resist to form a latent image of a desired pattern, developing the latent image to form a resist pattern, and conducting dry etching through the resist pattern as a mask, followed by removing the resist, whereby a desired pattern of the film is obtained. As an exposure source used in this process, ultraviolet (UV) light such as g-line (wavelength of 436 nm) and i-line (wavelength of 365 nm) have been used. However, as a pattern becomes finer, far ultraviolet light, vacuum ultraviolet light, electron beams, X-rays and other radiation, which have shorter wavelengths, have been utilized. Particularly, recently, an excimer lasers such as KrF lasers having a wavelength of 248 nm and ArF lasers having a wavelength of 193 nm have become available as light sources. These light sources are expected to be effective in the formation of a finer resist patterns. Note that, in the specification of the present application, the term "radiation" includes light from these various light sources, i.e., ultraviolet light, far ultraviolet light, vacuum ultraviolet light, electron beams (EB), X rays, various kinds of laser beams and others.

In order to obtain a submicron pattern using an exposure light having a shorter wavelength such as far ultraviolet light or vacuum ultraviolet light, a resist is required to have an excellent transparency at the wavelength of the exposure light. Further, the resist is required to have a dry etching resistance sufficient to act as a mask. Such a resist is, for example, a radiation-sensitive material characterized by comprising a polymer or copolymer of an acrylate or α-substituted acrylate having an adamantane skeleton in the ester portion thereof, which has been invented by the present inventors (see, Japanese Unexamined Patent Publication (Kokai) No. 4-39665). Further, similar resists include, for example, a chemically amplified radiation-sensitive material characterized by comprising a polymer or copolymer of an acrylate or α-substituted acrylate having a norbornene skeleton in the ester portion thereof (see, Japanese Unexamined Patent Publication (Kokai) No. 5-257281) as well as a chemically amplified radiation-sensitive material comprising a polymer or copolymer of cyclohexylmaleimide (see, Japanese Unexamined Patent Publication (Kokai) No. 5-257285).

The chemically amplified radiation-sensitive materials or resist materials invented by the present inventors can simultaneously exhibit an excellent etching resistance which is equivalent to that of the conventional novolak resists, and a high transparency in the far ultraviolet region, because they contain one or more alicyclic hydrocarbon groups which can resist etching conditions. In addition to these advantages, if these resist materials are developed with a mixed solution consisting of an aqueous organic alkaline solution and isopropyl alcohol as a developer as is taught in Japanese Unexamined Patent Publication (Kokai) No. 7-234511 by the present inventors, after the patterning exposure thereof, it becomes possible to obtain a higher sensitivity and thus a higher resolution.

However, the prior art chemical amplification resists particularly containing an alicyclic hydrocarbon group in a molecule thereof, including the above-described chemical amplification resists found by the present inventors, can frequently cause a problem of difficulty in the pattern formation, because a hydrophobic property of the resist polymers or copolymers can be increased as a result of introduction of said alicyclic group. Namely, due to a high hydrophobic property thereof, the polymers or copolymers cannot exhibit a good compatibility with the developer, and thus the aqueous alkaline solution as the developer can only slightly permeate into the resist film. As a result, a notably increased stress is generated in the resist film during development thereof, because sudden permeation of the developer into the resist film is caused due to difficulty in a smooth development process. Consequently, during the development of the exposed resist film, the film is liable to form cracks and cause peeling of the resulting patterns. The proposed addition of isopropyl alcohol to an alkaline developer is effective to avoid the formation of cracks and peeling of the patterns, however, it needs an additional and specific waste treatment step, because the waste developer contains isopropyl alcohol, i.e., an organic solvent.

SUMMARY OF THE INVENTION

The object of the present invention is to provide an improved method for forming a resist pattern, in which a chemical amplification resist having a high transparency to various radiation, including excimer light, and an excellent dry etching resistance is used, and according to which method it becomes possible to increase a permeability of the developer into the resist film, thereby improving a profile of the resulting resist patterns, and it also becomes possible to reduce the formation of cracks and peeling of the patterns, i.e., provide stable patterning characteristics, during the development step.

The present inventors have now found that the above object can be accomplished by a method for the formation of resist patterns from a chemically amplified resist, which comprises the steps of:

coating a resist on a substrate to be fabricated, said resist comprising an alkali-insoluble polymer or copolymer having a repeating unit containing a protected alkali-soluble group in which a protecting group to the alkali-soluble group can be cleaved upon action of an acid, thereby making the polymer or copolymer alkali-soluble, and an acid generator capable of generating an acid upon exposure of the resist to a radiation;

selectively exposing the resulting resist film on the substrate to a radiation capable of inducing the generation of an acid from said acid generator; and developing a latent image formed upon said selective exposure in the resist film with an organic alkaline developer in the presence of a surface active agent containing a higher alkyl group in a molecule thereof.

As will be appreciated from the subsequent detailed description of the present invention, the pattern formation method of the present invention is particularly characterized by conducting the development of the patternwise exposed resist film by using an organic alkaline developer in combination with a surface active agent or surfactant containing a higher alkyl group, preferably, containing at least three carbon atoms in a molecule thereof, in addition to use of a chemical amplification resist, i.e., for example, a resist consisting of an acrylate or methacrylate polymer or copolymer containing an alicyclic moiety in an ester portion thereof and an acid generator. Surprisingly, the present method can improve the permeability of the developer into the resist film and also a profile of the resulting resist patterns. As a consequence, the present method allows resolution of line and space (L&S) patterns of not more than 0.2 μm in a ArF lithography, for example.

In addition, when the developer used in combination with the chemical amplification resist is an aqueous or alcoholic solution of a specific organic alkali substance such as the ammonium compound or the morpholine compound described hereinafter with reference to the general formula thereof, it becomes possible to control a compatibility of the resist with the developer and a solubility of the resist in the developer, thereby moderating a stress in the resist film generated during the development. The stress in the resist film can inhibit peeling off of the resist patterns from the substrate and formation of cracks, and thus stable patterning characteristics can be obtained in the resulting resist patterns. Accordingly, the present invention can be advantageously utilized in the production of semiconductor devices such as LSIs and VLSIs.

DESCRIPTION OF THE PREFERRED EMBODIMENTS

A resist used in the resist pattern formation method according to the present invention is a chemical amplification resist comprising a combination of an alkali-insoluble polymer or copolymer wherein a protecting group is cleaved with an acid so that the polymer or copolymer may become alkali-soluble (the term "copolymer" used herein includes a copolymer comprising three or more components), and an acid generator.

The polymer or copolymer has a protected alkali-soluble group, as described above. Typical examples of suitable alkali-soluble group include a carboxylic acid group, to which the present invention is not restrictive. For example, the protected carboxylic acid group is a unit capable of generating a carboxylic acid upon elimination of the protecting group from the unit with an acid. Examples of suitable units include quaternary carbon esters such as t-butyl ester, t-amyl ester and α,α-dimethyl benzyl ester; esters comprising acetals such as tetrahydropyranyl ester; esters comprising β-oxyketones such as 3-oxocyclohexyl ester; and the like. As the protecting group for the alkali-soluble group, mention may be made of, preferably, quaternary carbon groups such as t-butyl group and the like or β-oxyketone group such as 3-oxocyclohexyl group and the like.

The polymer or copolymer may preferably further comprise an alicyclic hydrocarbon group in a repeating unit thereof. It is more preferable that such an alicyclic hydrocarbon group is included in repeating units other than those comprising the above-described protected alkali-soluble group. Examples of suitable alicyclic hydrocarbon groups include those comprising the following compounds as the skeleton.

(1) Adamantane and derivatives thereof,
(2) Norbornane and derivatives thereof,
(3) Cyclohexane and derivatives thereof,
(4) Perhydroanthracene and derivatives thereof,
(5) Perhydronaphthalene and derivatives thereof,
(6) Tricyclo [5, 2, 1, $0^{2, 6}$] decane and derivatives thereof,
(7) Bicyclohexane and derivatives thereof,
(8) Spiro [4, 4] nonane and derivatives thereof, and
(9) Spiro [4, 5] decane and derivatives thereof.

These compounds can be represented by the following structural formulae, respectively.

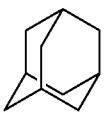

(1)

(2)

(3)

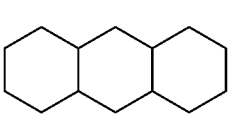

(4)

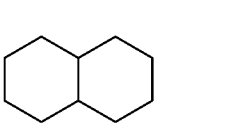

(5)

(6)

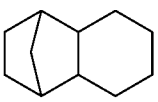

(7)

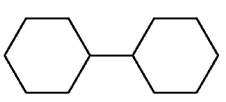

(8)

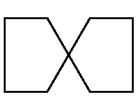

(9)

Among these compounds, in order to obtain a dry etching resistance comparable to that of the novolak type resist, it is particularly preferred to use a compound containing a condensed ring such as adamantane ring.

Acid-decomposable polymers or copolymers used in the method of the present invention can be optionally selected from various kinds of compounds. However, (meth) acrylate polymers having the following formula (I), (meth) acrylate copolymers having the following formula (II) and (meth) acrylate terpolymers having the following formulae (III) to (V) are preferably used.

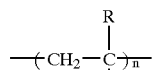
(I)

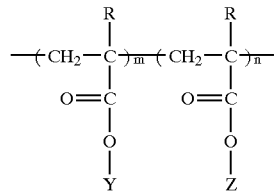
(II)

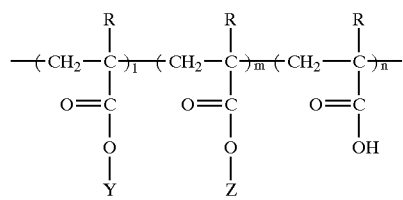
(III)

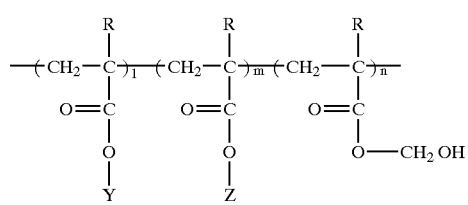
(IV)

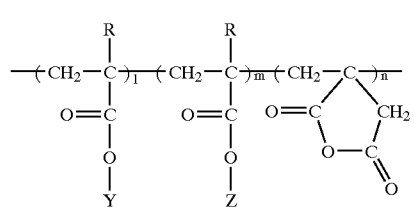
(V)

in which

R may be the same or different and each represents a hydrogen or a lower alkyl group such as a methyl group, Y represents an alicyclic hydrocarbon group, preferably an adamantyl, norbornyl, cyclohexyl, tricyclo [5. 2. 1. 0] decane and the like, Z represents a protecting group for carboxylic acid, preferably, a quaternary carbon group or β-oxyketone group, for example, t-butyl group, t-amyl group, 3-oxocyclohexyl group and the like, and l, m and n each represents an optional positive integer.

More specifically, the polymers or copolymers advantageously used in the practice of the present invention include, but are not limited to, the following compounds. Note that, in the formulae, l, m and n have the same definitions as those mentioned above.

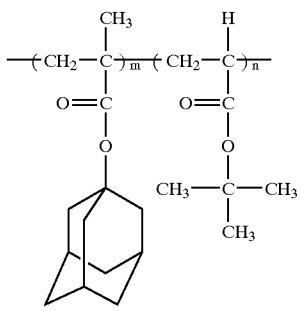
(VI)

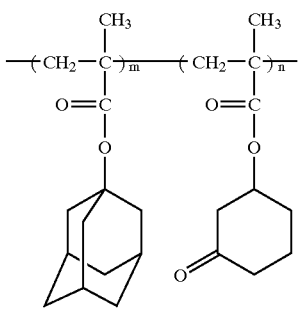
(VII)

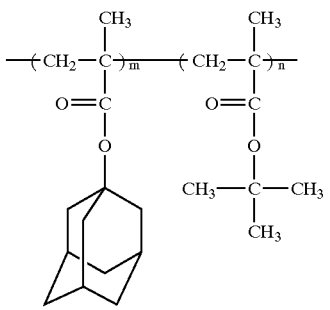
(VIII)

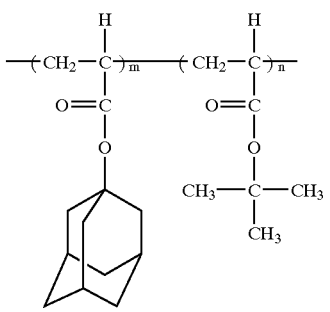
(IX)

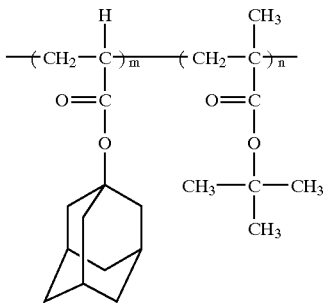
(X)

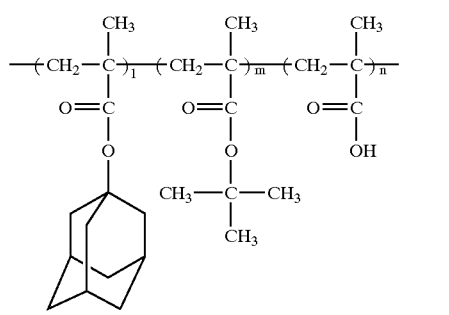 (XI)

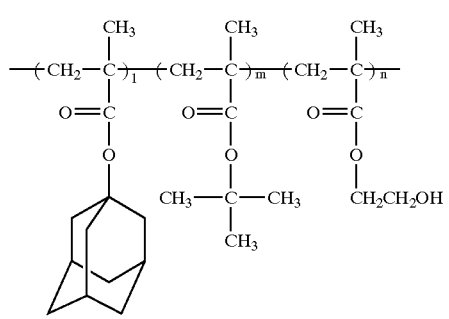 (XII)

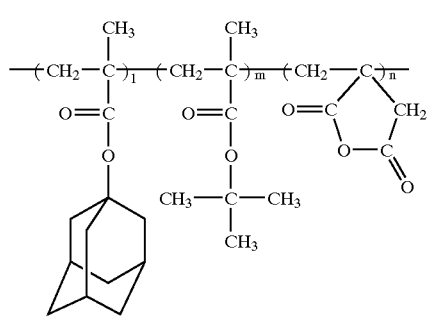 (XIII)

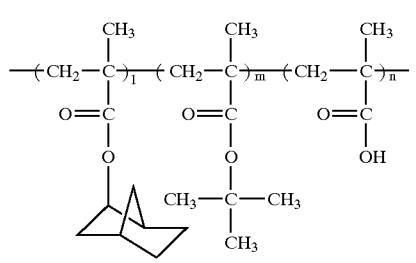 (XIV)

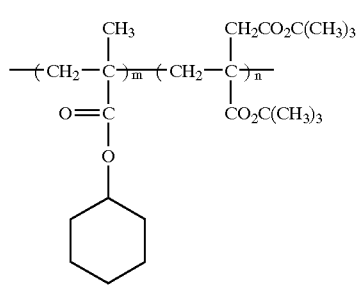 (XV)

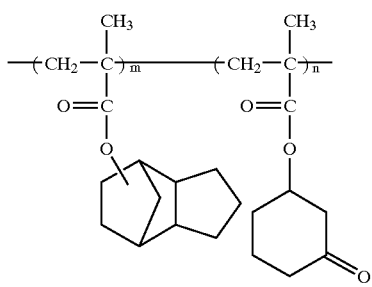 (XVI)

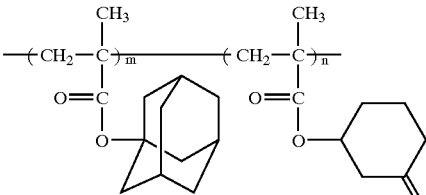 (XVII)

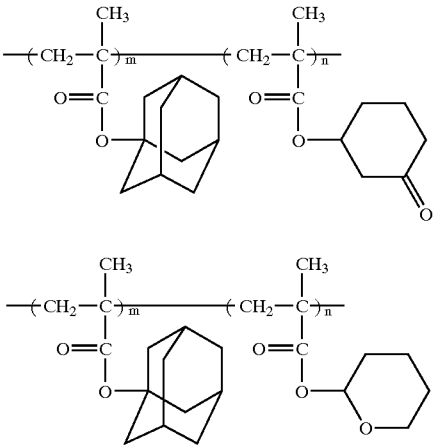 (XVIII)

Further, acid generators used in combination with said polymers or copolymers in the chemical amplification resists can be those commonly used in the resist chemistry. Namely, they can be substances capable of generating protonic acids upon irradiation by radiation such as ultraviolet light, far ultraviolet light, vacuum ultraviolet light, electron beams, X-rays or laser beams. Typical examples of acid generators suitable in the practice of the present invention include, but are not limited to, the following compounds:

(1) Diazonium salts represented by the following formula:

$$Ar-N_2^+X^-$$

wherein Ar represents a substituted or unsubstituted aromatic group, for example, a phenyl group, or represents an alicyclic group, and X represents a halogen, for example, Cl, Br, I or F, $BF_4$, $BF_6$, $PF_6$, $AsF_6$, $SbF_6$, $CF_3SO_3$, $ClO_4$ or an organic sulfonic acid anion;

(2) Iodonium salts represented by the following formula:

or

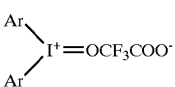

wherein Ar and X have the same definitions as those mentioned above;-

(3) Sulfonium salts represented by the following formulae:

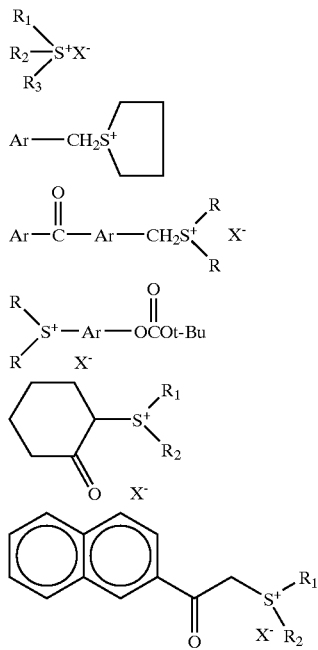

wherein R, Ar and X have the same definitions as those mentioned above, and $R_1$, $R_2$ and $R_3$ may be the same or different and each represents a substituted or unsubstituted hydrocarbon group of 1 to 6 carbon atoms with the proviso that at least one of these hydrocarbon groups is an alkyl group of 2 to 6 carbon atoms; for instance, R is a methyl group, and $R_1$, $R_2$ and $R_3$ each is a phenyl group;

(4) Sulfonic acid esters represented by the following formula:

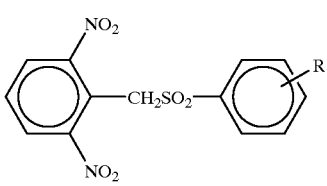

or

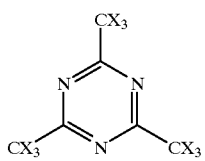

wherein Ar and R have the same definitions as those mentioned above;

(5) Oxazole derivatives represented by the following formula:

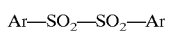

wherein X has the same definition as that mentioned above, provided that one of the —$CX_3$ groups may be a substituted or unsubstituted aryl or alkenyl group;

(6) s-triazine derivatives represented by the following formula:

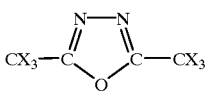

wherein X has the same definition as that mentioned above, provided that one of the —$CX_3$ groups may be a substituted or unsubstituted aryl or alkenyl group;

(7) Disulfone derivatives represented by the following formula:

$$Ar-SO_2-SO_2-Ar$$

wherein Ar has the same definition as that mentioned above;

(8) Imide compounds represented by the following formulae:

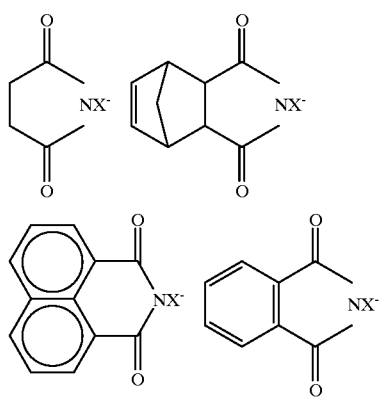

wherein X has the same definition as that mentioned above; and (9) Other compounds, for example, oxime sulfonate, diazonaphthoquinone and benzoin tosylate.

More particularly, some typical examples of these acid generators include the following compounds:

Triphenylsulfonium hexafluoroantimonate

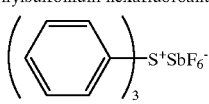

Triphenylsulfonium hexafluorophosphate

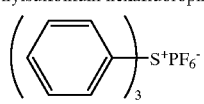

Diphenyliodonium hexafluorophosphate

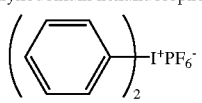

-continued

Benzoin tosylate

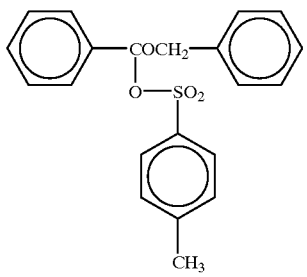

In the practice of the present invention, a chemical amplification resist is prepared by using the above-described polymer or copolymer and an acid generator as the starting materials. For example, such resist can be prepared by polymerizing a monomer selected in order to form an object polymer or copolymer in the presence of an appropriate polymerization initiator, as currently conducted in resist chemistry, then adding a selected acid generator to a solution of the resulting polymer or copolymer to form a resist solution. The polymerization conditions and the polymerization initiator used herein can be optionally selected from a wide range of conditions and initiators. For example, as one example of suitable polymerization initiators, the following compounds can be mentioned:

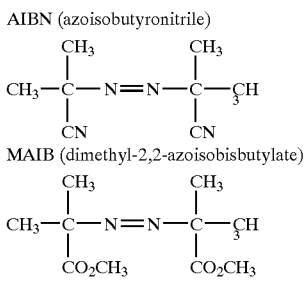

An amount of an acid generator to be added to a polymer or copolymer can be widely varied. Generally, the amount of the acid generator is about 1 to 30% by weight, preferably about 1 to 15% by weight.

A solvent used for the preparation of a resist solution can be varied depending upon a kind of a resist, coating conditions and other factors. However, preferably, the solvent is, for example, an organic solvent such as cyclohexanone, propylene glycol monomethyl ether acetate (PGMEA) or ethyl lactate.

The solution of the resulting chemical amplification resist is coated on a substrate to be fabricated. The substrate used herein can be any base material usually used in semiconductor devices and other devices. Specifically, the base material can be silicon, an oxide coating, polysilicon, a nitride film, aluminum and others. One or more circuits can be or may not be previously built-in on the substrate. In order to improve the adhesion of the resist to a substrate, optionally, the substrate may be preferably treated with an adhesion accelerator such as hexamethyldisilazane (HMDS).

The resist solution can be coated by using a conventional coating device such as a spin coater, dip coater and roller coater. A layer thickness of the resist film formed can be widely varied depending upon various factors such as an object for utilization of the resist film. However, the layer thickness is generally within a range of about 0.3 to 2.0 μm.

Then, the formed resist film is preferably heated or prebaked, prior to being selectively exposed to a patterning radiation, at a temperature of about 60° to 150° C., preferably about 60° to 100° C. for about 60 to 180 seconds. This prebaking can be conducted by using a heating means such as a hot plate.

Further, in the case that the resist film should contain a top coat or protective coating formed thereon, the top coat can be formed by spin-coating a solution of olefinic resin, for example, over the resist film, and then baking the coating at a temperature of about 100° C.

After prebaking the resist film, the film is selectively exposed to a patterning radiation on a conventional exposure apparatus. As a suitable exposure apparatus, a commercially available ultraviolet ray (far ultraviolet ray, vacuum ultraviolet ray) exposure apparatus, X-ray exposure apparatus, electron beam exposure apparatus, excimer stepper and other devices may be mentioned. Exposing conditions can be appropriately selected in each case. As a result of this selective exposure, an acid is released from an acid generator in the resist film.

Then, prior to the development step, the exposed resist film is preferably subjected to Post Exposure Bake (PEB), whereby a cleavage reaction of a protecting group is caused with the acid as a catalyst. This Post Exposure Bake can be effected in the same manner as in the above-described prebaking. For example, the baking temperature is about 60° to 150° C., preferably about 100° to 150° C. When a top coat is used in combination with the resist film, it should be removed by applying an organic solvent, for example, after PEB and before development.

After completion of PEB, the exposed resist film is developed in accordance with the method of the present invention. More particularly, the resist film is developed with an organic alkaline developer in the presence of a surface active agent containing a higher alkyl group in the molecules thereof. The surface active agent may be previously contained in the developer or, alternatively, it may be added to the developer before or during the development. The term "higher alkyl group" used herein means an alkyl group containing at least three carbon atoms, and, more particularly, it means an alkyl group containing 3 to 20 carbon atoms such as propyl, butyl, pentyl, hexyl, octyl, nonyl, decyl, pentadecyl, octadecyl, eicosyl and other groups. If desired, these alkyl groups may be substituted with any substituent.

As has been already described, the acid generator contained in the resist material in the present method can generate and release an acid upon exposure of the resist material to the radiation. Because the acid thus generated can act as a catalyst for the reaction caused by the subsequent heating, i.e., PEB, a cleavage reaction of the light-sensitive group from the resist polymer or copolymer is resulted, thus producing a carboxylic acid. As a function of the production of the carboxylic acid, a polarity of the exposed areas in the resist film can largely varied so that an alkali solubility of said exposed areas can be notably increased in comparison with that of the unexposed areas. The differential alkali solubility in the resist film enables satisfactory formation of the resist patterns.

In addition to the above-mentioned function of the acid generator, a function of the surface active agent added to an alkaline developer is important in the practice of the present invention. Generally, the surface active agent contains both a hydrophilic moiety and a hydrophobic moiety in a molecule thereof, and thus, if added to an alkaline developer, the surface active agent can remarkably change the properties at the interfacial boundary between the resist film, i.e., polymeric film and the alkaline developer. The effects of such change of the interfacial properties are evidenced by a change of the interfacial angle of contact, i.e., contact angle, of the developer to the polymeric film. The contact angle between the polymeric film consisting of an alicyclic group-containing polymer or copolymer and the alkaline developer is determined to be large, because said polymer or copolymer can exhibit a very strong hydrophobic property due to the presence of the alicyclic group. However, when a suitable amount of the surface active agent containing an higher alkyl group is added to said alkaline developer, it becomes possible to reduce the contact angle to the extent of 10° or more. The reduction of the contact angle means an increase of the compatibility between the polymeric film and the alkaline developer, and thus an easy permeation of the developer into the polymeric film. Consequently, a satisfactory profile of resist patterns can be obtained.

In the practice of the present invention, the surface active agent or surfactant added to an alkaline developer, preferably an aqueous or alcoholic solution of organic alkali substance, may be any one of conventional cationic surfactants, anionic surfactants, amphoteric surfactants and nonionic surfactants. The surfactant may be used alone or, if desired, it may be used as a mixture of two or more surfactants.

The following is typical examples of the surfactants which can be advantageously used in the practice of the present invention. Note in the described chemical formulae that $R_I$ may be the same or different and each represents any substituent group with the proviso that at least one of the substituent group $R_I$ is a higher alkyl group of not less than three carbon atoms, $R_{II}$ represents a higher alkyl group of not less than three carbon atoms, M represents an ammonium ion, n is a positive integer, and X is as defined above.

Cationic surfactants
quaternary ammonium salt:

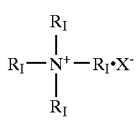

alkyl amine salt:

pyridinium salts:

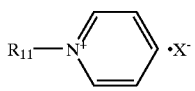

Anionic surfactants
salt of higher fatty acids:

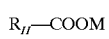

salt of higher alkyl sulfonic acids:

salt of alkylbenzene sulfonic acids:

salt of alkylnaphthalene sulfonic acids:

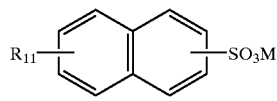

salt of alkylsulfuric acids:

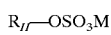

salt of alkylphosphoric acids:

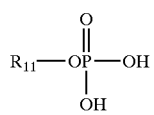

salt of polyoxyethylene alkylether sulfuric acids:

Amphoteric surfactants
alkylbetaines:

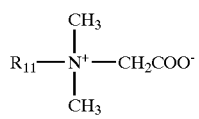

alkylimidazoline derivatives:

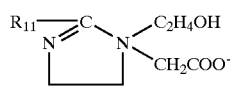

amino acids:

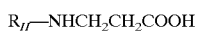

Nonionic surfactants
fatty acid glycerol:

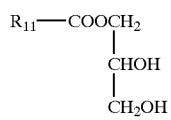

fatty acid sorbitan:

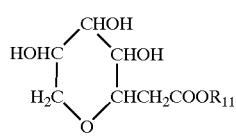

polyoxyethylene alkylether:

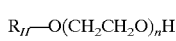

polyoxyethylene alkylphenylether:

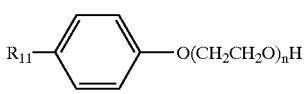

polyethylene glycol of fatty acids:

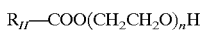

alkanol amide of fatty acids:

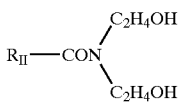

The amount of the surfactant added to the organic alkaline developer can be widely varied depending upon the desired effects, the specific developer used and other factors, however, generally, it is preferred that the surfactant is used in an amount of about 0.01 to 1 molar equivalent, more preferably, about 0.01 to 0.5 molar equivalent, with regard to the concentration of an organic alkali substance in the organic alkaline developer.

The organic alkaline developer used herein is preferably an aqueous or alcoholic solution of the organic alkali substance which is conventionally used in the preparation of the alkaline developer, and typical examples of suitable organic alkali substance include:

an ammonium compound having the following formula:

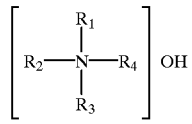

in which $R_1$, $R_2$, $R_3$ and $R_4$ may be the same or different, and each represents a substituted or unsubstituted hydrocarbon group having 1 to 6 carbon atoms, provided that at least one of these groups is an alkyl group having 2 to 6 carbon atoms; or a morphaline compound having the following formula:

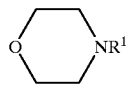

in which $R^1$ represents a hydrogen atom or any substituent group, for example, an alkyl group such as methyl.

These organic alkali substances may be used alone or, if desired, they may be used as a mixture of two or more substances.

Typical examples of the ammonium compound suitable as a developer include, but are not limited to, the following compounds:

Tetramethyl ammonium hydroxide (TMAH);
Tetraethyl ammonium hydroxide (TEAH);
Tetrabutyl ammonium hydroxide (TBAH); and
Tetrapropyl ammonium hydroxide (TPAH). Further, typical examples of the morpholine compound suitable as a developer include ethyl morpholine represented by the following formula:

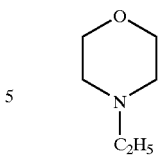

and others.

These developer compounds, along with the selected surfactant, are dissolved in water or an alcohol such as methanol, ethanol or isopropyl alcohol to form a developing solution. In the preparation of the developing solution, the order of the addition of the developer compound and the surfactant may be freely changed. The concentration of a developer to be dissolved can be varied widely. However, it is generally preferred to be about 0.1 to 15% by weight, more preferably, about 0.1 to 10% by weight. The concentration of the surfactant has been already described. The developing time is, but is not limited to, generally about 1 to 5 minutes, preferably about 1 to 3 minutes. As the result of the development, the exposed area of the resist film is dissolved and eliminated so that a desired resist pattern can be obtained. Finally, the resulting resist pattern is rinsed with pure water and dried in accordance with any conventional method.

According to the pattern formation method of the present invention, the use of the above-described ammonium or morpholine compounds as a developer for the chemical amplification resist is effective to control a compatibility of the developing solution with the resist resin and a solubility of the resin in the developing solution so that a stress generated in the resist film during the development process may be suitably moderated to thereby produce resist patterns having stable patterning characteristics with inhibited peeling of the resist film and formation of cracks.

It has already been found that the developing solution used in the present invention can produce particularly noticeable effects in the development of the exposed resist comprising a polymer or copolymer having a low polarity. However, it can also provide satisfactory and comparable effects in other resists. As a resist which can provide extremely noticeable effects, mention may be made of adamantane or the substituents thereof, norbornane or the substituents thereof, cyclohexane or the substituents thereof, tricyclo [5. 2. 1. $0^{2,6}$] decane or the substituents thereof, and other alicyclic moiety-containing resins.

EXAMPLES

The present invention will be further described with reference to some working examples thereof. Note, however, that the appended examples included herein do not restrict the present invention.

Example 1

A copolymer of 3-oxocyclohexyl methacrylate and adamantylmethacrylate of the following formula:

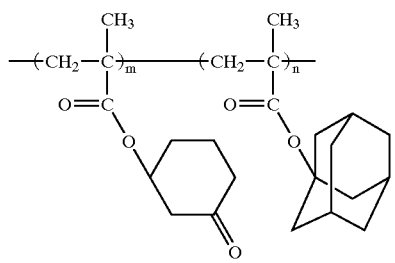

having a composition ratio (m:n) of 54:46, a weight average molecular weight (Mw) of 21,800 and a dispersibility (Mw/Mn) of 1.69 was prepared in accordance with a conventional polymerization method.

The copolymer was dissolved in cyclohexanone to prepare a solution of 15% by weight of cyclohexanone. To the cyclohexanone solution, 5% by weight of an acid generator, triphenylsulfonium hexafluoroantimonate (TPSSbF$_6$) was added. The resulting resist solution was spin-coated on a silicon substrate, pretreated with hexamethyldisilazane (HMDS), at a thickness of 0.7 µm, and the coated substrate was prebaked on a hot plate at 100° C. for 100 seconds.

After completion of prebaking, the resulting resist film was selectively exposed to a pattern of a KrF laser beam having a wavelength of 248 nm by means of a KrF excimer stepper (manufactured by Nikon K. K., NA=0.45). The exposed resist film was then subjected to PEB at 100° C. for 60 seconds. Thereafter, the exposed resist film was developed with an aqueous solution of 2.38% by weight of tetramethylammonium hydroxide (TMAH) containing 0.5 molar equivalent of tetra n-butyl ammonium chloride of the following formula:

$$[CH_3(CH_2)_3]_4N \cdot Cl$$

for 60 seconds, followed by rinsing with a pure water for 30 seconds.

As a result, the desired resist pattern corresponding to the laser beam pattern used as an exposure pattern could be obtained without causing cracks. In the present Example, the threshold energy Eth of the irradiation dose was 36 mJ/cm$^2$ and the resolution power was 0.30 µm L&S (line and space).

Example 2

The procedure described in the above-described Example 1 was repeated, provided that in the present Example, as a developing solution, the aqueous TMAH solution was replaced with an aqueous morpholine solution having the concentration of 0.27N. The type and amount of the surfactant added to the developer was the same as those of the Example 1. As in the Example 1, a satisfactory resist pattern having Eth of 54 mJ/cm$^2$ and a resolution power of 0.30 µm L&S could be obtained.

Example 3

The procedure described in the above-described Example 1 was repeated, provided that in the present Example, the amount of tetra n-butylammonium chloride added as the surfactant to the developing solution was reduced to 0.01 molar equivalent. As in the Example 1, a satisfactory resist pattern having Eth of 38 mJ/cm$^2$ and a resolution power of 0.30 µm L&S could be obtained.

Example 4

The procedure described in the above-described Example 1 was repeated, provided that in the present Example, as a surfactant added to the developing solution, tetra n-butylammonium chloride was replaced with the same amount (0.5 molar equivalent) of ammonium 1-butane sulfonate of the following formula:

$$CH_3CH_2CH_2CH_2SO_3NH_4.$$

As in the Example 1, a satisfactory resist pattern having Eth of 38 mJ/cm$^2$ and a resolution power of 0.35 µm L&S could be obtained.

Comparative Example 1

The procedure described in the above-described Example 1 was repeated, provided that in the present Example, for the purpose of comparison, no surfactant was added to the developing solution and thus an aqueous solution of 2.38% by weight of TMAH was used as the developing solution. No resist pattern of not more than 0.5 µm L&S could be formed due to breakage of the line pattern.

Comparative Example 2

The procedure described in the above-described Example 1 was repeated, provided that in the present Example, for the purpose of comparison, the amount of the surfactant added to the developing solution was reduced to 0.005 molar equivalent. No effect obtained upon addition of the surfactant could be observed, and thus no resist pattern of not more than 0.5 µm L&S could be formed due to breakage of the line pattern.

Comparative Example 3

The procedure described in the above-mentioned Example 1 was repeated, provided that in the present Example, for the purpose of comparison, as a surfactant added to the developing solution, tetra n-butylammonium chloride was replaced with the same amount (0.5 molar equivalent) of tetraethylammonium chloride of the following formula:

$$(CH_3CH_2)_4N \cdot Cl.$$

No effect obtained upon addition of the surfactant could be observed, and thus no resist pattern of not more than 0.45 µm L&S could be formed due to breakage of the line pattern.

Comparative Example 4

The procedure described in the above-described Example 1 was repeated, provided that in the present Example, for the purpose of comparison, as a surfactant added to the developing solution, tetra n-butylammonium chloride was replaced with the same amount (0.5 molar equivalent) of tetramethylammonium chloride of the following formula:

$$(CH_3)_4N \cdot Cl.$$

As in the above-described Comparative Example 3, no effect obtained upon addition of the surfactant could be observed, and thus no resist pattern of not more than 0.45 µm L&S could be formed due to breakage of the line pattern.

Example 5

The procedure described in the above-described Example 1 was repeated, provided that in the present Example, as a surfactant added to the developing solution, tetra n-butylammonium chloride was replaced with the same amount (0.5 molar equivalent) of lauryl betain of the following formula:

$$C_{12}H_{25}-\overset{\overset{\displaystyle CH_3}{|}}{\underset{\underset{\displaystyle CH_3}{|}}{N^+}}-CH_2COO^-$$

As in the Example 1, a satisfactory resist pattern having Eth of 41 mJ/cm$^2$ and a resolution power of 0.35 µm L&S could be obtained.

Comparative Example 5

The procedure described in the above-described Example 1 was repeated, provided that in the present Example, for the purpose of comparison, as a surfactant added to the developing solution, tetra n-butylammonium chloride was replaced with the same amount (0.5 molar equivalent) of glycine betaine of the following formula:

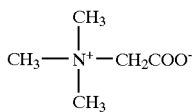

As in the above-described Comparative Examples 3 and 4, no effect obtained upon addition of the surfactant could be observed, and thus no resist pattern of not more than 0.45 μm L&S could be formed due to breakage of the line pattern.

Example 6

The procedure described in the above-described Example 1 was repeated, provided that in the present Example, as a surfactant added to the developing solution, tetra n-butylammonium chloride was replaced with the same amount (0.5 molar equivalent) of polyoxyethylene lauryl ether of the following formula:

$C_{12}H_{25}O(CH_2CH_2O)_nH.$

As in the Example 1, a satisfactory resist pattern having Eth of 40 mJ/cm$^2$ and a resolution power of 0.35 μm L&S could be obtained.

Example 7

The copolymer of 3-oxocyclohexyl methacrylate and adamanthylmethacrylate prepared in the above-described Example 1 was dissolved in cyclohexanone to prepare a solution of 15% by weight of cyclohexanone. To the cyclohexanone solution, 2% by weight of an acid generator, triphenylsulfonium hexafluoroantimonate (TPSSbF$_6$) was added. The resulting resist solution was spin-coated on a silicon substrate, pretreated with hexamethyldisilazane (HMDS), at a thickness of 0.7 μm, and the coated substrate was prebaked on a hot plate at 100° C. for 100 seconds.

After completion of prebaking, the resulting resist film was selectively exposed to a pattern of a ArF laser beam having a wavelength of 193 nm by means of a ArF exposure device (manufactured by Nikon K. K., NA=0.55). The exposed resist film was then subjected to PEB at 150° C. for 60 seconds. Thereafter, the exposed resist film was developed with an aqueous solution of 2.38% by weight of tetramethylammonium hydroxide (TMAH) containing 0.5 molar equivalent of tetra n-butyl ammonium chloride for 60 seconds, followed by rinsing with a pure water for 30 seconds.

As a result, the desired resist pattern corresponding to the laser beam pattern used as an exposure pattern could be obtained without causing cracks. In the present Example, the threshold energy Eth of the irradiation dose was 17 mJ/cm$^2$ and the resolution power was 0.20 μm L&S (line and space).

Example 8

The procedure described in the above-described Example 7 was repeated, provided that in the present Example, as a surfactant added to the developing solution, tetra n-butylammonium chloride was replaced with the same amount (0.5 molar equivalent) of tetra n-propylammonium chloride of the following formula:

$[CH_3(CH_2)_2]_4N\cdot Cl.$

As in the Example 7, a satisfactory resist pattern having Eth of 20 mJ/cm$^2$ and a resolution of 0.2 μm L&S could be obtained.

What is claimed is:

1. A method for the formation of resist patterns from a chemically amplified resist, consisting of:

coating a resist on a substrate to be fabricated, said resist comprising an alkali-insoluble polymer of a formula selected from the group of formulas II and IV consisting of

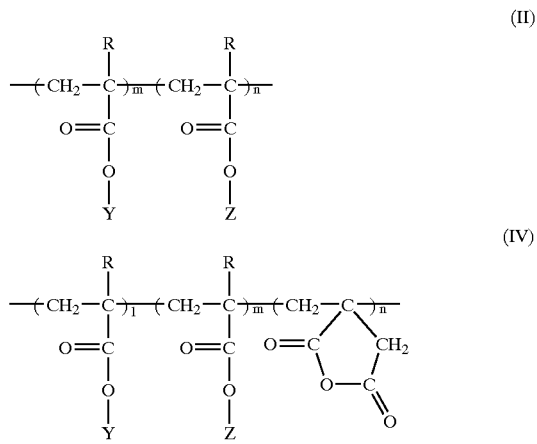

in which R represents a hydrogen or a lower alkyl group, Y represents an alicyclic hydrocarbon group; Z represents a quaternary carbon group or β-oxyketone group; 1, m and m each represent an optional positive integer; and said polymer having a repeating unit containing a protected alkali-soluble group in which a protecting group to the alkali-soluble group can be cleaved upon action of an acid, thereby making the polymer alkali-soluble, and an acid generator capable of generating an acid upon exposure of the resist to a radiation;

selectively exposing the resulting resist film on the substrate to excimer laser radiation capable of inducing the generation of an acid from said acid generator; and developing a latent image formed upon said selective exposure in the resist film with an organic alkaline developer in the presence of a surface active agent containing an alkyl group of 3 to 20 carbon atoms as well as both of a hydrophilic moiety and a hydrophobic moiety in a molecule thereof.

2. The method as defined in claim 1, in which said resist is an alicyclic resist.

3. The method as defined in claim 2, which further comprises the step of heating the resulting resist film after formation of said film and prior to selective exposure thereof to the radiation, and the step of heating the exposed resist film after the selective exposure step and before the developing step.

4. The method as defined in claim 2, in which said developer is an aqueous or alcoholic solution of organic alkali substance, and said solution contains a surface active agent with the alkyl group of 3 to 20 carbon atoms.

5. The method as defined in claim 2, in which said surface active agent is at least one member selected from the group consisting of a cationic surface active agent, anionic surface active agent, amphoteric surface active agent and nonionic surface active agent.

6. The method as defined in claim 5, in which said cationic surface active agent is a quaternary ammonium salt of the formula:

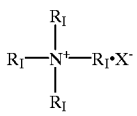

in which
- $R_1$ may be the same or different and represents any substituent group with the proviso that at least one of the substituent groups $R_1$ is an alkyl group of not less than three carbon atoms, and
- X represents a halogen, $BF_4$, $BF_6$, $PF_6$, $AsF_6$, $SbF_6$, $CF_3SO_3$, $ClO_4$ or an anion of organic sulfonic acid;

a salt of alkylamine of the formula:

$R_{II}-NH_2 \cdot HX$ in which
- $R_{II}$ represents an alkyl group of not less than three carbon atoms, and
- X represents as defined above; or a pyridinium salt of the formula:

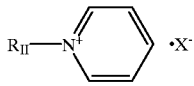

in which $R_{II}$ and X each is as defined above.

7. The method as defined in claim 5, in which said anionic surface active agent is a salt of higher fatty acids of the formula:

$R_{II}-COOM$ in which
- $R_{II}$ represents an alkyl group of not less than three carbon atoms, and
- M represents an ammonium salt;

a salt of higher alkyl sulfonic acids of the formula:

$R_{II}-SO_3M$ in which $R_{II}$ and M each is as defined above;

a salt of alkylbenzene sulfonic acids of the formula:

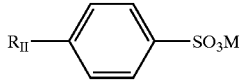

in which $R_{II}$ and M each is as defined above;

a salt of alkylnaphthalene sulfonic acid of the formula:

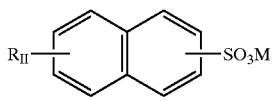

in which $R_{II}$ and M each is as defined above;

a salt of alkylsulfuric acids of the formula:

$R_{II}-OSO_3M$ in which $R_{II}$ and M each is as defined above;

a salt of alkylphosphoric acids of the formula:

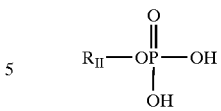

in which $R_{II}$ is as defined above; or a salt of polyoxyethylene alkylether sulfuric acids of the formula:

$R_{II}-O(CH_2CH_2O)_nSO_3M$ in which
- $R_{II}$ and M each is as defined above, and
- n is a positive integer.

8. The method as defined in claim 5, in which said amphoteric surface active agent is alkylbetaines of the formula:

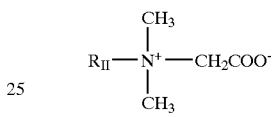

in which $R_{II}$ represents an alkyl group of not less than three carbon atoms;

alkylimidazoline derivatives of the formula:

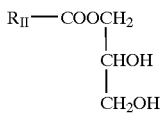

in which $R_{II}$ is as defined above; or amino acids of the formula;

$R_{II}-NHCH_2CH_2COOH$ in which $R_{II}$ is as defined above.

9. The method as defined in claim 5, in which said nonionic surface active agent is a glycerol of fatty acids of the formula:

$$R_{II}-COOCH_2$$
$$CHOH$$
$$CH_2OH$$

in which $R_{II}$ represents an alkyl group of not less than three carbon atoms, a sorbitan of fatty acids of the formula:

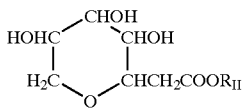

in which $R_{II}$ is as defined above;

polyoxyethylene alkylether of the formula:

$R_{II}-O(CH_2CH_2O)_nH$ in which

R$_{II}$ is as defined above, and n is a positive integer;

polyoxyethylene alkylphenylether of the formula:

$$R_{II}-\underset{}{\bigcirc}-O(CH_2CH_2O)_nH$$

in which R$_{II}$ and n each is as defined above;

polyethylene glycol of fatty acids of the formula:

$$R_{II}-COO(CH_2CH_2O)_nH$$

in which R$_{II}$ and n each is as defined above, or alkanol amide of fatty acids of the formula:

$$R_{II}-CON\begin{matrix}C_2H_4OH\\C_2H_4OH\end{matrix}$$

in which R$_{II}$ is as defined above.

10. The method as defined in claim 2, in which in the developing step of the latent image, the surface active agent is used in an amount of 0.01 to 1 molar equivalent with regard to the concentration of an organic alkali substance in the organic alkaline developer.

11. The method as defined in claim 2, in which an organic alkali substance of the organic alkaline developer used in the developing step is an ammonium compound having the following formula:

$$\left[\begin{matrix}R_1\\R_2-N-R_4\\R_3\end{matrix}\right]OH$$

in which

R$_1$, R$_2$, R$_3$ and R$_4$ may be the same or different, and each represents a substituted or unsubstituted hydrocarbon group having 1 to 6 carbon atoms, provided that at least one of these groups is an alkyl group having 2 to 6 carbon atoms.

12. The method as defined in claim 2, in which an organic alkali substance of the organic alkaline developer used in the developing step is a morpholine compound having the following formula:

$$O\underset{}{\bigcirc}NR^1$$

in which

R$^1$ represents a hydrogen atom or a substituent group.

13. A method for the formation of resist patterns from a chemically amplified resist, consisting essentially of:

coating a resist on a substrate to be fabricated, said resist comprising an alkali-insoluble polymer of a formula selected form the group of formulas I, II, III and IV consisting of $$-(CH_2-\underset{\underset{\underset{Z}{|}}{\underset{|}{O}}}{\overset{\overset{\overset{R}{|}}{|}}{C}})_n-$$ (I)

$$-(CH_2-\underset{\underset{\underset{Y}{|}}{\underset{|}{O}}}{\overset{\overset{\overset{R}{|}}{|}}{C}})_m-(CH_2-\underset{\underset{\underset{Z}{|}}{\underset{|}{O}}}{\overset{\overset{\overset{R}{|}}{|}}{C}})_n-$$ (II)

$$-(CH_2-\underset{\underset{\underset{Y}{|}}{\underset{|}{O}}}{\overset{\overset{\overset{R}{|}}{|}}{C}})_1-(CH_2-\underset{\underset{\underset{Z}{|}}{\underset{|}{O}}}{\overset{\overset{\overset{R}{|}}{|}}{C}})_m-(CH_2-\underset{\underset{O-CH_2OH}{\underset{|}{O}}}{\overset{\overset{\overset{R}{|}}{|}}{C}})_n-$$ (III)

$$-(CH_2-\underset{\underset{\underset{Y}{|}}{\underset{|}{O}}}{\overset{\overset{\overset{R}{|}}{|}}{C}})_1-(CH_2-\underset{\underset{\underset{Z}{|}}{\underset{|}{O}}}{\overset{\overset{\overset{R}{|}}{|}}{C}})_m-(CH_2-\underset{\underset{O-C=O}{O=C}}{\overset{\overset{}{|}}{C}}\underset{CH_2}{\diagdown})_n-$$ (IV)

in which R represents a hydrogen or a lower alkyl group, Y represents an alicyclic hydrocarbon group; Z represents a quaternary carbon group or β-oxyketone group; 1, m and n each represent an optional positive integer; and said polymer having a repeating unit containing a protected alkali-soluble group in which a protecting group to the alkali-soluble group can be cleaved upon action of an acid, thereby making the polymer alkali-soluble, and an acid generator capable of generating an acid upon exposure of the resist to a radiation;

selectively exposing the resulting resist film on the substrate to excimer laser radiation capable of inducing the generation of an acid from said acid generator; and developing a latent image formed upon said selective exposure in the resist film with an organic alkaline developer in the presence of a surface active agent containing an alkyl group of 3 to 20 carbon atoms as well as both of a hydrophilic moiety and a hydrophobic moiety in a molecule thereof and the surface active agent being one member selected from the group consisting of a cationic surface active agent, an anionic surface active agent, an amphoteric surface active agent and a nonionic surface active agent, said surface active agent being further defined as follows:
said cationic surface active agent is a quaternary ammonium salt of the formula:

$$R_I-\underset{\underset{R_I}{|}}{\overset{\overset{R_I}{|}}{N^+}}-R_I \cdot X^-$$

in which
- $R_I$ may be the same or different and represents any substituent group with the proviso that at least one of the substituent groups $R_I$ is an alkyl group of not less than three carbon atoms, and
- X represents a halogen $BF_4$, $BF_6$, $PF_6$, $AsF_6$, $SbF_6$, $CF_3SO_3$, $ClO_4$ or an anion of organic sulfonic acid;

a salt of alkylamine of the formula: $R_{II}-NH_2 \cdot HX$ in which
- $R_{II}$ represents an alkyl group of not less than three carbon atoms, and
- X represents as defined above; or a pyridinium salt of the formula:

$$R_{II}-\underset{}{\overset{}{N^+}}\diagdown\diagup \cdot X^-$$

in which $R_{II}$ and X each is as defined above;

said anionic surface active agent is a salt of higher fatty acids of the formula:

$$R_{II}-COOM$$

in which
- $R_{II}$ represents an alkyl group of not less than three carbon atoms, and
- M represents an ammonium salt;

a salt of higher alkyl sulfonic acids of the formula:

$$R_{II}-SO_3M$$

in which $R_{II}$ and M each is as defined above;

a salt of alkylbenzene sulfonic acids of the formula:

$$R_{II}-\langle\text{benzene}\rangle-SO_3M$$

in which $R_{II}$ and M each is as defined above;

a salt of alkylnaphthalene sulfonic acid of the formula:

$$R_{II}-\langle\text{naphthalene}\rangle-SO_3M$$

in which $R_{II}$ and M each is as defined above;

a salt of alkylsulfuric acids of the formula:

$$R_{II}-OSO_3M$$

in which $R_{II}$ and M each is as defined above;

a salt of alkylphosphoric acids of the formula:

$$R_{II}-O\underset{\underset{OH}{|}}{\overset{\overset{O}{\|}}{P}}-OH$$

in which $R_{II}$ is as defined above; or a salt of polyoxyethylene alkylether sulfuric acids of the formula:

$$R_{II}-O(CH_2CH_2O)_nSO_3M$$

in which
- $R_{II}$ and M each is as defined above, and
- n is a positive integer;

said amphoteric surface active agent is alkylbetaines of the formula:

$$R_{II}-\underset{\underset{CH_3}{|}}{\overset{\overset{CH_3}{|}}{N^+}}-CH_2COO^-$$

in which $R_{II}$ represents an alkyl group of not less than three carbon atoms;

alkylimidazoline derivatives of the formula:

$$R_{II}-C\underset{N}{\overset{N}{\diagup\diagdown}}\underset{CH_2COO^-}{\overset{C_2H_4OH}{\diagdown\diagup}}$$

in which $R_{II}$ is as defined above; or amino acids of the formula:

$$R_{II}-NHCH_2CH_2COOH$$

in which $R_{II}$ is as defined above;

said nonionic surface active agent is a glycerol of fatty acids of the formula:

$$R_{II}-COOCH_2-CHOH-CH_2OH$$

in which $R_{II}$ represents an alkyl group of not less than three carbon atoms, a sorbitan of fatty acids of the formula:

$$\text{HOHC}\underset{H_2C}{\overset{CHOH}{\diagdown}}\underset{O}{\overset{CHOH}{\diagup}}CHCH_2COOR_{II}$$

in which $R_{II}$ is as defined above;

polyoxyethylene alkylether of the formula:

$$R_{II}-O(CH_2CH_2O)_nH$$

in which
- $R_{II}$ is as defined above, and
- n is a positive integer;

polyoxyethylene alkylphenylether of the formula:

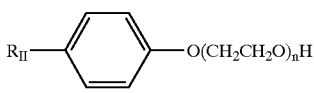

in which $R_{II}$ and n each is as defined above;
polyethylene glycol of fatty acids of the formula:

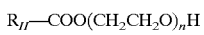

in which $R_{II}$ and n each is as defined above; or
alkanol amide of fatty acids of the formula:

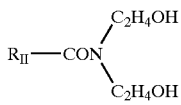

in which $R_{II}$ is as defined above.

14. A method for the formation of resist patterns from a chemically amplified resist, consisting essentially of:
coating a resist on a substrate to be fabricated, said resist comprising an alkali-insoluble polymer of a formula selected from the group of formulas II and IV consisting of

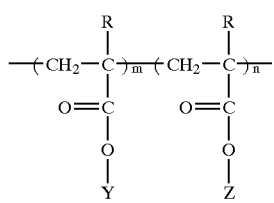

(II)

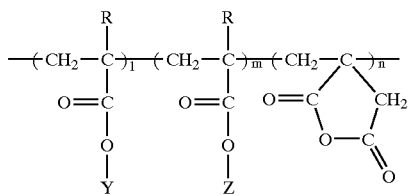

(IV)

in which R represents a hydrogen or a lower alkyl group, Y represents an alicyclic hydrocarbon group; Z represents a quaternary carbon group or β-oxyketone group; 1, m and n each represent an optional positive integer; and said polymer having a repeating unit containing a protected alkali-soluble group in which a protecting group to the alkali-soluble group can be cleaved upon action of an acid, thereby making the polymer alkali-soluble, and an acid generator capable of generating an acid upon exposure of the resist to a radiation;
selectively exposing the resulting resist film on the substrate to excimer laser radiation capable of inducing the generation of an acid from said generator; and
developing a latent image formed upon said selective exposure in the resist film with an organic alkaline developer in the presence of a surface active agent containing an alkyl group of 3 to 20 carbon atoms as well as both of a hydrophilic moiety and a hydrophobic moiety in a molecule thereof and the surface active agent being one member selected from the group consisting of a cationic surface active agent, an anionic surface active agent, an amphoteric surface active agent and a nonionic surface active agent,
said surface active agents being further defined as follows:
cationic surface active agent is a quaternary ammonium salt of the formula:

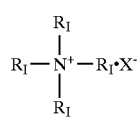

in which
$R_1$ may be the same or different and represents any substituent group with the proviso that at least one of the substituent groups $R_1$ is an alkyl group of not less than three carbon atoms, and
X represents a halogen $BF_4$, $BF_6$, $PF_6$, $AsF_6$, $SbF_6$, $CF_3SO_3$, $ClO_4$ or an anion of organic sulfonic acid;
a salt of alkylamine of the formula:

in which
$R_{II}$ represents an alkyl group of not less than three carbon atoms, and
X represent as defined above; or
a pyridinium salt of the formula:

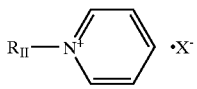

in which $R_{II}$ and X each is as defined above;
said anionic surface active agent is a salt of higher fatty acids of the formula:

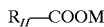

in which
$R_{II}$ represents an alkyl group of not less than three carbon atoms, and
M represents an ammonium salt;
a salt of higher alkyl sulfonic acids of the formula:

in which $R_{II}$ and M each is as defined above;
a salt of alkylbenzene sulfonic acid of the formula:

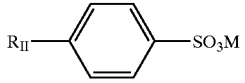

in which $R_{II}$ and M each is as defined above;
a salt of alkylnaphthalene sulfonic acid of the formula:

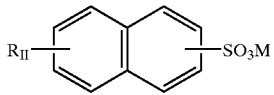

in which $R_{II}$ and M each is as defined above;
a salt of alkylsulfuric acids of the formula:

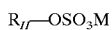

in which $R_{II}$ and M each is as defined above;

a salt of alkylphosphoric acids of the formula:

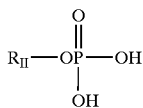

in which $R_{II}$ is as defined above; or a salt of polyoxyethylene alkylether sulfuric acids of the formula:

in which $R_{II}$ and M each is as defined above, and n is a positive integer;

said amphoteric surface active agent is alkylbetaines of the formula:

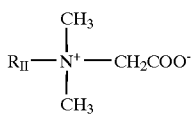

in which $R_{II}$ represents an alkyl group of not less than three carbon atoms;

alkylimidazoline derivatives of the formula:

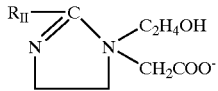

in which $R_{II}$ is as defined above; or amino acids of the formula:

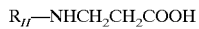

in which $R_{II}$ is as defined above:

said nonionic surface active agent is a glycerol of fatty acids of the formula:

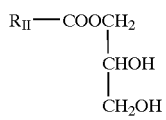

in which $R_{II}$ represents an alkyl group of not less than three carbon atoms, a sorbitan of fatty acids of the formula:

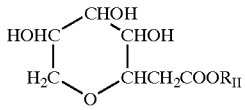

in which $R_{II}$ is as defined above;

polyoxyethylene alkylether of the formula:

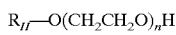

in which $R_{II}$ is as defined above, and n is a positive integer;

polyoxyethylene alkylphenylether of the formula:

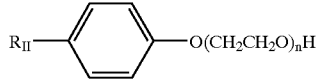

in which $R_{II}$ and n each is as defined above;

polyethylene glycol of fatty acids of the formula:

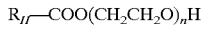

in which $R_{II}$ and n each is as defined above; or alkanol amide of fatty acids of the formula:

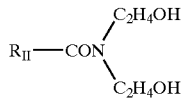

in which $R_{II}$ is as defined above.

* * * * *